(12) United States Patent
Yoo et al.

(10) Patent No.: US 9,392,670 B2
(45) Date of Patent: *Jul. 12, 2016

(54) WHITE LIGHT EMITTING DEVICE AND WHITE LIGHT SOURCE MODULE USING THE SAME

(71) Applicant: SAMSUNG ELECTRONICS CO., LTD., Suwon-si (KR)

(72) Inventors: Chul Hee Yoo, Suwon (KR); Young June Jeong, Suwon (KR); Young Sam Park, Seoul (KR); Seong Yeon Han, Gwangju (KR); Ho Yeon Kim, Incheon (KR); Hun Joo Hahm, Sungnam (KR); Hyung Suk Kim, Suwon (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 232 days.

This patent is subject to a terminal disclaimer.

(21) Appl. No.: 13/661,346

(22) Filed: Oct. 26, 2012

(65) Prior Publication Data
US 2013/0258211 A1    Oct. 3, 2013

Related U.S. Application Data

(60) Continuation of application No. 13/097,419, filed on Apr. 29, 2011, now Pat. No. 8,317,348, which is a continuation of application No. 12/081,726, filed on Apr. 21, 2008, now Pat. No. 7,959,312, which is a division of application No. 11/987,830, filed on Dec. 5, 2007, now Pat. No. 7,964,885.

(30) Foreign Application Priority Data

Dec. 5, 2006  (KR) .................... 10-2006-0122631
Feb. 6, 2007  (KR) .................... 10-2007-0012112

(51) Int. Cl.
*F21V 9/00*    (2015.01)
*H05B 33/12*   (2006.01)
(Continued)

(52) U.S. Cl.
CPC ............ *H05B 33/12* (2013.01); *C09K 11/0883* (2013.01); *C09K 11/7731* (2013.01);
(Continued)

(58) Field of Classification Search
USPC ......... 362/84, 97.1–97.3, 293, 267, 310, 800; 257/98–100, E33.061; 313/485–487, 313/502–504
See application file for complete search history.

(56) References Cited

U.S. PATENT DOCUMENTS 4,915,478 A   4/1990   Lenko et al.
5,803,579 A   9/1998   Turnbull et al.
(Continued)

FOREIGN PATENT DOCUMENTS

EP    1566848 A2      8/2005
JP    2000-223749 A   8/2000
(Continued)

OTHER PUBLICATIONS

Communication dated Feb. 14, 2012 from the State Intellectual Property Office of P.R.C. in counterpart Chinese application No. 201010180341.3.
(Continued)

*Primary Examiner* — Thomas M Sember

(57) ABSTRACT

A white light emitting device including: a blue light emitting diode chip having a dominant wavelength of 443 to 455 nm; a red phosphor disposed around the blue light emitting diode chip, the red phosphor excited by the blue light emitting diode chip to emit red light; and a green phosphor disposed around the blue light emitting diode chip, the green phosphor excited by the blue light emitting diode chip to emit green light, wherein the red light emitted from the red phosphor has a color coordinate falling within a space defined by four coordinate points (0.5448, 0.4544), (0.7079, 0.2920), (0.6427, 0.2905) and (0.4794, 0.4633) based on the CIE 1931 chromaticity diagram, and the green light emitted from the green phosphor has a color coordinate falling within a space defined by four coordinate points (0.1270, 0.8037), (0.4117, 0.5861), (0.4197, 0.5316) and (0.2555, 0.5030) based on the CIE 1931 color chromaticity diagram.

13 Claims, 7 Drawing Sheets

(51) Int. Cl.
*C09K 11/08* (2006.01)
*C09K 11/77* (2006.01)
*H01L 33/50* (2010.01)
*F21K 99/00* (2016.01)
*G02F 1/1335* (2006.01)

(52) U.S. Cl.
CPC .......... *C09K11/7734* (2013.01); *H01L 33/504* (2013.01); *F21K 9/00* (2013.01); *G02F 1/133603* (2013.01); *G02F 1/133609* (2013.01); *Y02B 20/181* (2013.01)

(56) References Cited

U.S. PATENT DOCUMENTS

| | | | |
|---|---|---|---|
| 6,600,175 | B1 | 7/2003 | Baretz et al. |
| 6,686,691 | B1 | 2/2004 | Mueller et al. |
| 6,978,079 | B2 | 12/2005 | Uwada et al. |
| 7,052,152 | B2 | 5/2006 | Harbers et al. |
| 7,250,715 | B2 | 7/2007 | Mueller et al. |
| 7,290,902 | B2 | 11/2007 | Suehiro et al. |
| 7,564,180 | B2 | 7/2009 | Brandes |
| 7,959,312 | B2 | 6/2011 | Yoo et al. |
| 2003/0228412 | A1* | 12/2003 | Chen .......................... 427/157 |
| 2005/0184638 | A1 | 8/2005 | Mueller et al. |
| 2005/0189863 | A1 | 9/2005 | Nagatomi et al. |
| 2005/0253158 | A1* | 11/2005 | Yasukawa et al. ............. 257/98 |
| 2006/0045832 | A1 | 3/2006 | Nagatomi et al. |
| 2006/0092618 | A1* | 5/2006 | Tanaka et al. .................. 362/19 |
| 2006/0197098 | A1 | 9/2006 | Aihara |
| 2006/0197432 | A1 | 9/2006 | Nagatomi et al. |
| 2006/0208262 | A1 | 9/2006 | Sakuma et al. |
| 2006/0255712 | A1 | 11/2006 | Masuda et al. |
| 2007/0090389 | A1 | 4/2007 | Liu et al. |
| 2007/0182887 | A1 | 8/2007 | Haga et al. |
| 2008/0048193 | A1 | 2/2008 | Yoo et al. |
| 2008/0128735 | A1 | 6/2008 | Yoo et al. |
| 2008/0180948 | A1 | 7/2008 | Yoon et al. |
| 2008/0265269 | A1 | 10/2008 | Yoo et al. |
| 2009/0059579 | A1 | 3/2009 | Shin et al. |
| 2009/0140630 | A1 | 6/2009 | Kijima et al. |
| 2009/0206353 | A1 | 8/2009 | Okazaki |

FOREIGN PATENT DOCUMENTS

| | | | |
|---|---|---|---|
| JP | 2002531956 | T | 9/2002 |
| JP | 2005277127 | A | 10/2005 |
| JP | 2006041096 | A | 2/2006 |
| JP | 2006063233 | A | 3/2006 |
| JP | 2008147190 | A | 6/2006 |
| JP | 2006237113 | A | 9/2006 |
| JP | 2006241249 | A | 9/2006 |
| JP | 2006245443 | A | 9/2006 |
| JP | 2006321974 | A | 11/2006 |
| JP | 2006324653 | A | 11/2006 |
| JP | 2007035885 | A | 2/2007 |
| KR | 20030026351 | A | 3/2003 |
| TW | 200635087 | A | 10/2006 |
| TW | 1266441 | B | 11/2006 |
| WO | 0033390 | A1 | 6/2000 |
| WO | 0215806 | A1 | 2/2002 |
| WO | 2003-080763 | A1 | 10/2003 |
| WO | 2006001558 | A1 | 1/2006 |
| WO | 2006019016 | A1 | 2/2006 |
| WO | 2006098450 | A1 | 9/2006 |
| WO | 2006121196 | A1 | 11/2006 |
| WO | 2006126817 | A1 | 11/2006 |
| WO | 2007077869 | A1 | 7/2007 |

OTHER PUBLICATIONS

Communication dated Jan. 5, 2012 from the State Intellectual Property Office of P.R.C. in counterpart Chinese application No. 200810084540.7.
Communication dated Jun. 5, 1012 issued by the European Patent Office in counterpart European Application No. 08250974.6.
Communication dated Mar. 6, 2012 from the Taiwanese Intellectual Property Office in counterpart Taiwanese application No. 097113754.
Communication from the Japanese Patent Office dated Jan. 4, 2011, in Application No. 2007-314934.
Communication issued Jul. 10, 2012 by the Japanese Patent Office in counterpart Japanese Application No. 2008-099196.
European Patent Office, "European Search Report and Written Opinion," issued in connection with European Patent Application No. 08250974.6-1235, dated Aug. 28, 2008.
Extended European Search Report issued May 13, 2011 in counterpart European Application No. 1157877.9.
Hirosaki et al., "Characterization and Properties of Green-Emitting β-SiAlON: Eu2+ Powder Phosphors for White Light-Emitting Diodes," pp. 211905-1-211905-3, vol. 86, No. 21, Applied Physics Letters, published on May 17, 2005.
Japanese Office Action issued in corresponding Japanese Application No. 2008-099196 on Aug. 30, 2011.
Japanese Patent Office, "Office Action," issued in connection with Japanese Patent Application No. 2007-314934, dated Jun. 15, 2010.
Kim et al. "Wide Color Gamut Backlight from Three-band White LED." Journal of the Optical Society of Korea, vol. 11, No. 2, Jun. 2007, pp. 67-70.
Notification of the First Office Action dated Aug. 12, 2010, issued by the State Intellectual Property Office of P.R.C. in counterpart Chinese Application No. 200810084540.7.
Office Action issued Aug. 1, 2012 by the State Intellectual Property Office of the People's Republic of China in counterpart Chinese Application No. 200810084540.7.
Piao et al., "Preparation of CaAlSiN3: Eu2+ Phosphors by the Self-Propagating High-Temperature Synthesis and Their Luminescent Properties," pp. 4592-4599, vol. 19, No. 18, Chem. Mater., published on Aug. 11, 2007.
State Intellectual Property Office of P.R.C., "Notification of the First Office Action," issued in connection with Chinese Patent Application No. 200810084540.7, dated Aug. 12, 2010.
Taiwanese Office Action issued on Jul. 4, 2011 in the corresponding Taiwanese Patent Application No. 096146012.
United States Patent and Trademark Office, "Advisory Action," issued in connection with U.S. Appl. No. 12/081,726, on Nov. 22, 2010.
United States Patent and Trademark Office, "Examiner's Interview Summary," issued in connection with U.S. Appl. No. 12/081,726, on Mar. 23, 2011.
United States Patent and Trademark Office, "Final Office Action," issued in connection with U.S. Appl. No. 11/987,830, on Feb. 10, 2011.
United States Patent and Trademark Office, "Final Office Action," issued in connection with U.S. Appl. No. 12/081,726, on Jun. 15, 2010.
United States Patent and Trademark Office, "Non-Final Office Action," issued in connection with U.S. Appl. No. 11/987,830, dated May 6, 2010.
United States Patent and Trademark Office, "Non-Final Office Action," issued in connection with U.S. Appl. No. 11/987,830, dated Jun. 24, 2010.
United States Patent and Trademark Office, "Non-Final Office Action," issued in connection with U.S. Appl. No. 11/987,830, dated Jan. 6, 2011.
United States Patent and Trademark Office, "Non-Final Office Action," issued in connection with U.S. Appl. No. 12/081,726, on Mar. 31, 2009.
United States Patent and Trademark Office, "Non-Final Office Action," issued in connection with U.S. Appl. No. 12/081,726, on Oct. 27, 2009.
United States Patent and Trademark Office, "Non-Final Office Action," issued in connection with U.S. Appl. No. 12/081,726, on Jan. 13, 2011.
United States Patent and Trademark Office, "Notice of Allowance," issued in connection with U.S. Appl. No. 12/081,726, on Apr. 18, 2011.

(56) References Cited

OTHER PUBLICATIONS

Yang et al., "Highly Stable Three-Band White Light from an InGan-Based Blue Light-Emitting Diode Chip Precoated with (Oxy)nitride Green/Red Phosphors," pp. 123503-1-123503-3, vol. 90, No. 12, Applied Physics Letters, published on Mar. 20, 2007.

Communication dated Apr. 9, 2013 issued by the State Intellectual Property Office of the People's Republic of China in counterpart Chinese Patent Application No. 200810084540.7.

Communication dated Nov. 23, 2012, issued by the State Intellectual Property Office for the People's Republic of China in counterpart Chinese Application No. 201010180341.3.

Communication dated Jun. 20, 2013 issued by the State Intellectual Property Office of the People's Republic of China in counterpart Chinese Patent Application No. 201010180341.3.

Full file history of U.S. Pat. No. 7,964,885 patented Jun. 21, 2011.

Full file history of U.S. Pat. No. 7,959,312 granted Jun. 14, 2011.

Full file history of Reexam Control No. 90/012,708 filed Oct. 22, 2012.

Mueller-Mach, et al., "White light emitting diodes for illumination," Proc. SPIE vol. 3938 (2000), pp. 30-41.

Uheda et al., "Luminescence Properties of a Red Phosphor, CaAlSiN3:Eu2+, for White Ligth-Emitting Diodes," Electrochem. Sol. State Lett. vol. 9, No. 4 H22-H25 (2006), available online Feb. 15, 2006.

Li et al., "Luminescence properties of red-emitting M2Si5N8:Eu2+ (M=Ca, Sr, Ba) LED conversion phospors," J. Alloys and Compounds, vol. 417, pp. 273-279 (2006), available online Nov. 3, 2005.

Piao et al., "Characterization and luminescence properties of Sr2Si5Ni8:Eu2+ phosphor for white light-emitting-diode illumination," Appl. Phys. Lett, vol. 88, 161908 (2006), pp. 161908-1-161908-3.

Full file history of U.S. Pat. No. 8,317,348 patented Nov. 27, 2012.

\* cited by examiner

WHITE LIGHT EMITTING DEVICE AND WHITE LIGHT SOURCE MODULE USING THE SAME

CROSS-REFERENCE TO RELATED APPLICATIONS

This application is a continuation of U.S. patent application Ser. No. 13/097,419, filed on Apr. 29, 2011, which is a continuation of U.S. patent application Ser. No. 12/081,726, filed on Apr. 21, 2008, which is a divisional of U.S. patent application Ser. No. 11/987,830, filed on Dec. 5, 2007, and claims priority from Korean Patent Application Nos. 2006-122631, filed on Dec. 5, 2006, and 2007-12112, filed on Feb. 6, 2007, in the Korean Intellectual Property Office. The entire disclosures of the prior applications are hereby incorporated by reference in their entirety.

BACKGROUND OF THE INVENTION

1. Field of the Invention

The present invention relates to a white light emitting device and a white light source module using the same, and more particularly, to a white light emitting device beneficially applicable to a backlight unit of a liquid crystal display to ensure high color reproducibility, and a white light source module using the same.

2. Description of the Related Art

Recently, a light emitting diode (LED) is highlighted as a light source of a backlight unit (BLU) employed in liquid crystal displays such as lap top computers, monitors, mobile phones and TVs. A cold cathode fluorescent lamp (CCFL) has been in use as a white light source of the BLU, but lately, a white light source module using the LED has captured attention due to its advantages such as better color representation, environment friendliness, higher performance and lower power consumption.

In a conventional white light source module for the BLU, a blue LED, a green LED and a red LED are arranged on a circuit board. FIG. 1 illustrates an example of such arrangement. Referring to FIG. 1, a white light source module 10 for a BLU includes a red R LED 12, a green G LED 14 and a blue LED 16 arranged on a circuit board 11 such as a printed circuit board. The R, G, and B LEDs 12, 14, and 16 may be mounted on the board 11 in a configuration of packages each including an LED chip of a corresponding color, or lamps. These R, G, and B LED packages or lamps may be repeatedly arranged on the board to form an overall white surface or line light source. As described above, the white light source module 10 employing the R, G, and B LEDs is relatively excellent in color reproducibility and an overall output light can be controlled by adjusting a light amount of the R, G, and B LEDs.

However, in the white light source module 10 described above, the R, G, and B LEDs 12, 14, and 16 are spaced apart from another, thereby potentially posing a problem to color uniformity. Moreover, to produce white light of a unit area, at least a set of R, G, and B LED chips is required since the three-colored LED chips constitute a white light emitting device. This entails complicated circuit configuration for driving and controlling the LED of each color, thus leading to higher costs for circuits. This also increases the manufacturing costs for packages and the number of the LEDs required.

Alternatively, to implement a white light source module, a white light emitting device having a blue LED and a yellow phosphor has been employed. The white light source module utilizing a combination of the blue LED and yellow phosphor is simple in circuit configuration and low in price. However, the white light source module is poor in color reproducibility due to relatively low light intensity at a long wavelength. Therefore, a higher-quality and lower-cost LCD requires a white light emitting device capable of assuring better color reproducibility, and a white light source module using the same.

Accordingly, there has been a call for maximum color reproducibility and stable color uniformity of the white light emitting device adopting the LED and phosphor, and the white light source module using the same.

SUMMARY OF THE INVENTION

An aspect of the present invention provides a white light emitting device with high color reproducibility and superior color uniformity.

An aspect of the present invention also provides a white light source module with high color reproducibility and superior color uniformity, which is manufactured with lower costs.

According to an aspect of the present invention, there is provided a white light emitting device including: a blue light emitting diode (LED) chip having a dominant wavelength of 443 to 455 nm; a red phosphor disposed around the blue LED chip, the red phosphor excited by the blue LED chip to emit red light; and a green phosphor disposed around the blue LED chip, the green phosphor excited by the blue LED chip to emit green light, wherein the red light emitted from the red phosphor has a color coordinate falling within a space defined by four coordinate points (0.5448, 0.4544), (0.7079, 0.2920), (0.6427, 0.2905) and (0.4794, 0.4633) based on the CIE 1931 chromaticity diagram, and the green light emitted from the green phosphor has a color coordinate falling within a space defined by four coordinate points (0.1270, 0.8037), (0.4117, 0.5861), (0.4197, 0.5316) and (0.2555, 0.5030) based on the CIE 1931 color chromaticity diagram.

The blue LED chip may have a full width at half-maximum (FWHM) of 10 to 30 nm, the green phosphor may have a FWHM of 30 to 100 nm and the red phosphor may have a FWHM of 50 to 200 nm. The red phosphor may include at least one of $CaAlSiN_3$:Eu and (Ca,Sr)S:Eu. The green phosphor may include at least one of $A_2SiO_4$:Eu, $SrGa_2S_4$:Eu and β-SiAlON, wherein A in $A_2SiO_4$:Eu is at least one of Ba, Sr and Ca.

The white light emitting device may further include a resin encapsulant encapsulating the blue LED chip, wherein the green phosphor and the red phosphor are dispersed in the resin encapsulant.

The white light emitting device may further include a resin encapsulant encapsulating the blue LED chip, wherein a first phosphor film including one of the green and red phosphors is formed along a surface of the blue LED chip between the green light emitting device chip and the resin encapsulant, and a second phosphor film including the other one of the green and red phosphors is formed on the resin encapsulant.

According to another aspect of the present invention, there is provided a white light source module including: a circuit board; a blue LED chip disposed on the circuit board and having a dominant wavelength of 443 to 455 nm; a red phosphor disposed around the blue LED chip, the red phosphor excited by the blue LED chip to emit red light; and a green phosphor disposed around the blue LED chip, the green phosphor excited by the blue LED chip to emit green light, wherein the red light emitted from the red phosphor has a color coordinate falling within a space defined by four coordinate points (0.5448, 0.4544), (0.7079, 0.2920), (0.6427, 0.2905) and (0.4794, 0.4633) based on the CIE 1931 color chromaticity diagram, and the green light emitted from the green phosphor has a color coordinate falling within a space defined by four coordinate points (0.1270, 0.8037), (0.4117, 0.5861), (0.4197, 0.5316) and (0.2555, 0.5030) based on the CIE 1931 color chromaticity diagram.

The blue LED chip may have a FWHM of 10 to 30 nm, the green phosphor may have a FWHM of 30 to 100 nm and the red phosphor may have a FWHM of 50 to 200 nm. The red phosphor may include at least one of $CaAlSiN_3$:Eu and (Ca, Sr)S:Eu. The green phosphor may include at least one of $A_2SiO_4$:Eu, $SrGa_2S_4$:Eu and β-SiAlON, wherein A in $A_2SiO_4$:Eu is at least one of Ba, Sr and Ca.

The white light source module may further include a resin encapsulant encapsulating the blue LED chip, wherein the blue LED chip is directly mounted on the circuit board.

The white light source module may further include a package body mounted on the circuit board, the package body defining a reflective cup, wherein the blue LED chip is mounted in the reflective cup defined by the package body.

The white light source module may further include a resin encapsulant formed inside the reflective cup defined by the package body, the encapsulant encapsulating the blue LED chip.

The white light source module may further include a resin encapsulant encapsulating the blue LED chip, wherein the green phosphor and the red phosphor are dispersed in the resin encapsulant.

The white light source module may further include a resin encapsulant encapsulating the blue light emitting device chip, wherein a first phosphor film including one of the green and red phosphors is formed along a surface of the blue LED chip between the blue light emitting diode chip and the resin encapsulant, and a second phosphor film including the other one of the green and red phosphors is formed on the resin encapsulant.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
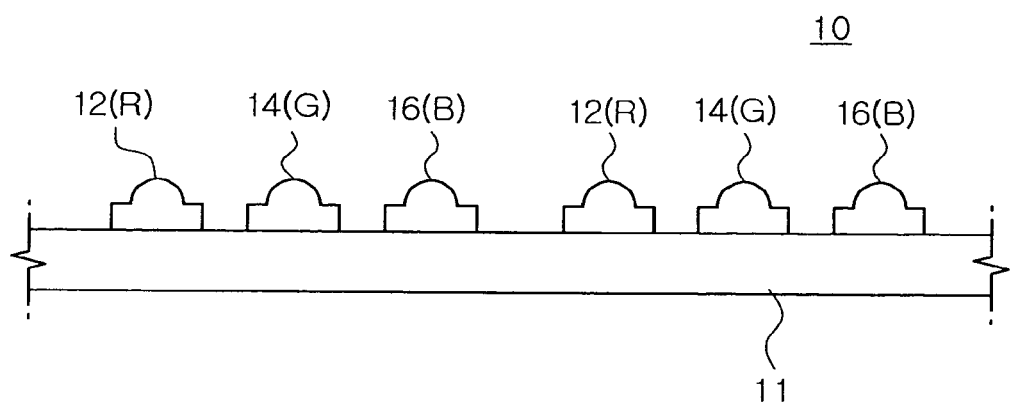
FIG. 1 is a cross-sectional view illustrating a conventional white light source module for a backlight unit.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
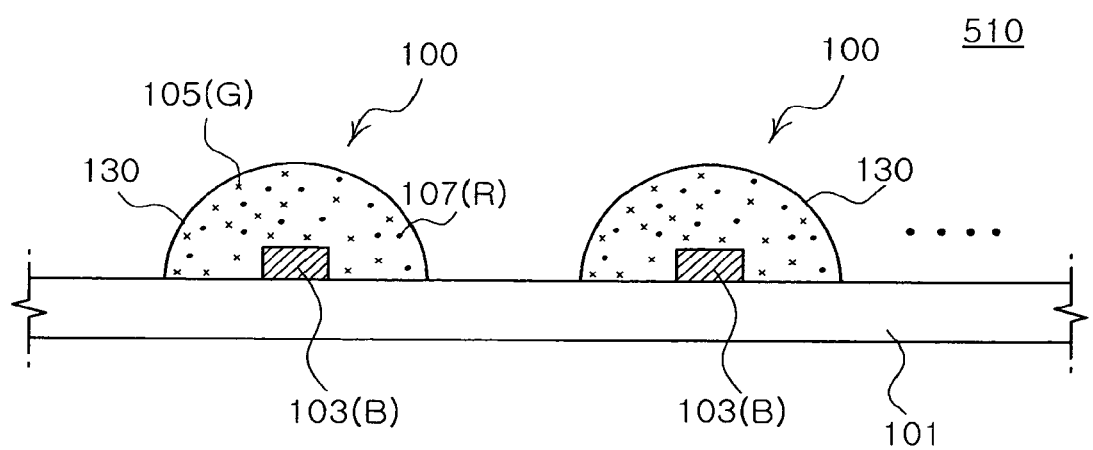
FIG. 2 is a cross-sectional view illustrating a white light emitting device and a white light source module according to an exemplary embodiment of the invention.

FIG. 2 is a schematic cross-sectional view illustrating a white light emitting device and a white light source module using the same according to an exemplary embodiment of the invention. Referring to FIG. 2, the white light source module 510 includes a circuit board 101 such as a printed circuit board, and at least one white light emitting device 100 disposed on the circuit board 101. The white light emitting device 100 includes a blue B light emitting diode (LED) chip 103, a green G phosphor 105 and a red R phosphor 107. The green phosphor 105 and the red phosphor 107 are excited by the blue LED chip 103 to emit green light and red light, respectively. The green light and the red light are mixed with a portion of the blue light from the blue LED chip 103 to produce white light.

Particularly, according to the present embodiment, the blue LED chip 103 is directly mounted on the circuit board 101 and the phosphors 105 and 107 are dispersed and mixed uniformly in a resin encapsulant 130 encapsulating the blue LED chip 103. The resin encapsulant 130 may be formed, for example, in a semi-circle which serves as a kind of lens. Alternatively, the resin encapsulant 130 may be formed of one of an epoxy resin, a silicone resin and a hybrid resin. As described above, the blue LED chip 103 is directly mounted on the circuit board 101 by a chip-on-board technique, thereby allowing the white light emitting device 100 to achieve a greater view angle more easily.

One of an electrode pattern and a circuit pattern (not shown) is formed on the Circuit board 101, and the circuit pattern is connected to an electrode of the blue LED chip 103 by e.g., wire bonding or flip chip bonding. This white light source module 510 may include a plurality of the white light emitting devices 100 to form a surface or line light source with a desired area, thereby beneficially utilized as a light source of a backlight unit of the LCD device.

The inventors of the present invention have defined a dominant wavelength of the blue LED chip 103 to be in a specific range and a color coordinate of the red and green phosphors 105 and 107 to be within a specific space based on the CIE 1931 color chromaticity diagram. This enabled the inventors to realize maximum color reproducibility from a combination of the green and red phosphors and the blue LED chip.

Specifically, to obtain maximum color reproducibility from a combination of the blue LED chip-green phosphor-red phosphor, the blue LED chip 103 has a dominant wavelength of 443 to 455 nm. Also, the red light emitted from the red phosphor 107 excited by the blue LED chip 103 has a color coordinate falling within a space defined by four coordinate points (0.5448, 0.4544), (0.7079, 0.2920), (0.6427, 0.2905) and (0.4794, 0.4633) based on the CIE 1931 (x, y) color chromaticity diagram. Moreover, the green light emitted from the green phosphor excited by the blue LED chip 103 has a color coordinate falling within a space defined by (0.1270, 0.8037), (0.4117, 0.5861), (0.4197, 0.5316) and (0.2555, 0.5030) based on the CIE 1931 color chromaticity diagram.

Figure 6:
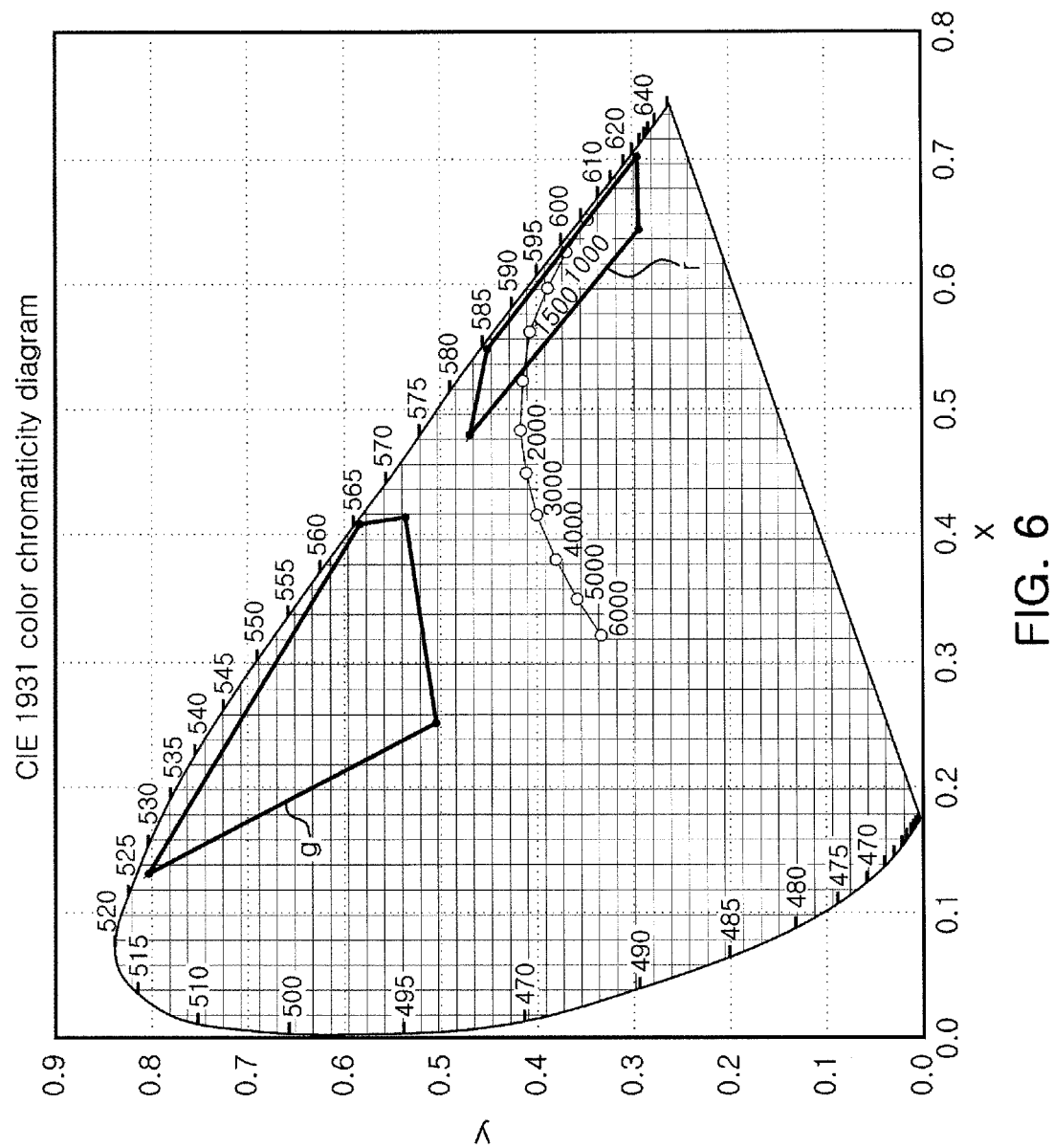
FIG. 6 illustrates a color coordinate space of phosphors used in a white light emitting device according to an exemplary embodiment of the invention.

FIG. 6 illustrates color coordinate spaces of the red and green phosphors described above. Referring to FIG. 6, the CIE 1931 color chromaticity diagram is marked with a quadrilateral-shaped space r composed of four coordinate points (0.5448, 0.4544), (0.7079, 0.2920), (0.6427, 0.2905) and (0.4794), 0.4633) and a quadrilateral-shaped space g composed of four coordinate points (0.1270, 0.8037), (0.4117, 0.5861), (0.4197, 0.5136) and (0.2555, 0.5030). As described above, the red phosphor and green phosphor are selected such that color coordinates thereof fall within the quadrilateral-shaped spaces r and g, respectively.

Here, a dominant wavelength is a wavelength value derived from a curve obtained by integrating an actually-measured spectrum graph of an output light of the blue LED chip and a luminosity curve. The dominant wavelength is a value considering visibility of a person. This dominant wavelength corresponds to a wavelength value at a point where a line connecting a center point (0.333, 0.333) of the CIE 1931 color chromaticity diagram to the actually-measured color coordinate meets a contour line of the CIE 1931 chromaticity diagram. It should be noted that a peak wavelength is different from the dominant wavelength. The peak wavelength has the highest energy intensity. The peak wavelength is a wavelength value indicating the highest intensity in the spectrum graph of the actually-measured output light, regardless of luminosity.

Here, the blue LED chip 103 has a dominant wavelength of 443 to 455 nm. The red phosphor 107 has a color coordinate falling within a quadrilateral space defined by four coordinate points (0.5446, 0.4544), (0.7079, 0.2920), (0.6427, 0.2905) and (0.4794, 0.4633), based on the CIE 1931 color chromaticity diagram. The green phosphor 105 has a color coordinate falling within a quadrilateral space defined by four coordinate points (0.1270, 0.8037), (0.4117, 0.5861), (0.4197, 0.5316) and (0.2555, 0.5030). Accordingly, a liquid crystal display (LCD) device employing the white light source module 510 for a backlight unit may exhibit high color reproducibility across a very large color coordinate space covering a substantially entire s-RGB space on the CIE 1976 chromaticity diagram (see FIG. 7). This high color reproducibility is hardly attainable from a conventional combination of a blue LED chip and red and green phosphors.

The blue LED chip and red and green phosphors falling outside the dominant wavelength range and color coordinate space as described above may degrade color reproducibility or color quality of the LCD. Conventionally, the blue LED chip used along with the red and green phosphors to obtain white light has a dominant wavelength of typically 460 nm or more. However, according to the present embodiment, the blue light has a shorter dominant wavelength than the conventional one and the red and green phosphors have a color coordinate falling within the quadrilateral space as described above, thereby producing higher color reproducibility which is hardly achieved by the prior art.

The blue LED chip 103 may adopt a group-III nitride semiconductor LED device in general use. Also, the red phosphor 107 may utilize a nitride phosphor such as $CaAlSiN_3$:Eu. This nitride red phosphor is less vulnerable to the external environment such as heat and moisture than a yellow phosphor, and less likely to be discolored. Notably, the nitride red phosphor exhibits high excitation efficiency with respect to the blue LED chip having a dominant wavelength set to a specific range of 443 to 455 nm to obtain high color reproducibility. Other nitride phosphors such as $Ca_2Si_5N_8$:Eu or the yellow phosphor such as (Ca, Sr)S:Eu may be utilized as the red phosphor 107. The green phosphor 105 may adopt a silicate phosphor such as $A_2SiO_4$:Eu where A is at least one of Ba, Sr and Ca. For example, the green phosphor 105 may employ $(Ba, Sr)_2SiO_4$:Eu. The silicate phosphor demonstrates high excitation efficiency with respect to the blue LED chip having a dominant wavelength of 443 to 455 nm. Alternatively, one of $SrGa_2S_4$:Eu and β-SiAlON (Beta-SiAlON) may be utilized as the green phosphor 105.

Particularly, the blue LED chip 103 has a full width at half maximum (FWHM) of 10 to 30 nm, the green phosphor 105 has a FWHM of 30 to 100 nm, and the red phosphor 107 has a FWHM of 50 to 200 nm. The light sources 103, 105, and 107 with the FWHM ranging as described above produces white light of better color uniformity and higher color quality. Especially, the blue LED chip 103 having a dominant wavelength of 443 to 455 nm and a FWHM of 10 to 30 nm significantly enhances excitation efficiency of the $CaAlSiN_3$:Eu or (Ca,Sr)S:Eu red phosphor and the $A_2SiO_4$:Eu, $SrGa_2S_4$:Eu, or β-SiAlON green phosphor. Here, A in $A_2SiO_4$:Eu is at least one of Ba, Sr, and Ca.

According to the present embodiment, the blue LED chip has a dominant wavelength of a predetermined range and the green and red phosphors have color coordinates within a predetermined space. This allows superior color reproducibility than a conventional combination of the blue LED chip and yellow phosphor, and than a conventional combination of the blue LED chip and green and red phosphors, respectively. This also improves excitation efficiency and overall light efficiency as well.

Furthermore, according to the present embodiment, unlike the conventional white light source module using the red, green and blue LED chips, a fewer number of LED chips are required and only one type of the LED chip, i.e., blue LED chip is required. This accordingly reduces manufacturing costs for packages and simplifies a driving circuit. Notably, an additional circuit may be configured with relative simplicity to increase contrast or prevent blurring. Also, only one LED chip 103 and the resin encapsulant encapsulating the LED chip 103 allow white light of a unit area to be emitted, thereby ensuring superior color uniformity to a case where the red, green and blue LED chips are employed.

Figure 3:
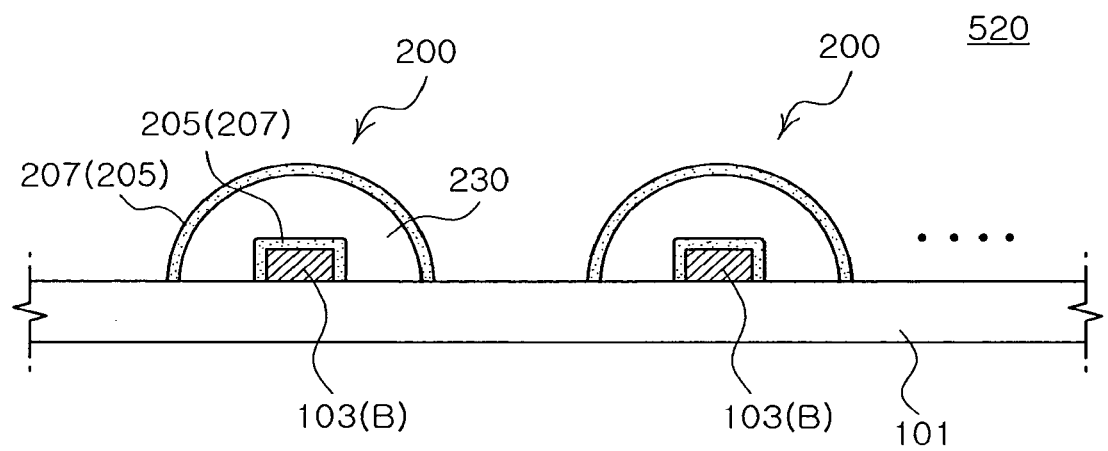
FIG. 3 is a cross-sectional view illustrating a white light emitting device and a white light source module according to an exemplary embodiment of the invention.

FIG. 3 is schematic cross-sectional view illustrating a white light emitting device 200 and a white light source module 520 using the same. In the embodiment of FIG. 3, a blue LED chip 103 is directly mounted on a circuit board 101 by a chip-on-board technique. The blue LED chip 103 constitutes the white light emitting device 200 of a unit area together with a red phosphor and a green phosphor excited by the blue LED chip 103. Moreover, to achieve maximum color reproducibility, the blue LED chip 103 has a dominant wavelength range, and the red phosphor and green phosphor have a color coordinate space as described above, respectively. That is, the blue LED chip 103 has a dominant wavelength of 443 to 455 nm. The red phosphor has a color coordinate falling within a quadrilateral space defined by four coordinate points (0.5448, 0.4544), (0.7079, 0.2920), (0.6427, 0.2905) and (0.4794, 0.4633) on the CIE 1931 color chromaticity diagram. The green phosphor has a color coordinate falling within a quadrilateral space defined by four coordinate points (0.1270, 0.8037), (0.4117, 0.5861), (0.4197, 0.5316) and (0.2555, 0.5030).

However, according to the present embodiment, the red and green phosphors are not dispersed and mixed in a resin encapsulant but provided as a phosphor film. Specifically, as shown in FIG. 3, a green phosphor film 205 containing the green phosphor is thinly applied along a surface of the blue LED chip 103 and a semi-circular transparent resin encapsulant 230 is formed on the green phosphor film 205. Also, a red phosphor film 207 containing the red phosphor is applied on a surface of the transparent resin encapulant 230. The green phosphor film 205 and the red phosphor film 207 may be located reversely with each other. That is, the red phosphor film 207 may be applied on the blue LED chip 103 and the green phosphor film 205 may be applied on the resin encapsulant 230. The green phosphor film 205 and the red phosphor film 207 may be formed of a resin containing green phosphor particles and red phosphor particles, respectively. The phosphors contained in the phosphor films 207 and 205 may employ one of a nitride, a yellow phosphor and a silicate phosphor as described above.

As described above, in the white light emitting device 200, the green phosphor film 205, the transparent resin encapsulant 230, and the red phosphor film 207 are formed to further enhance color uniformity of white light outputted. When the green and red phosphors (powder mixture) are merely dispersed in the resin encapsulant, the phosphors are not uniformly distributed due to difference in weight between the phosphors during resin curing, thus risking a problem of layering. This may reduce color uniformity in a single white light emitting device. However, in a case where the green phosphor film 205 and the red phosphor film 207 separated by the resin encapuslant 230 are adopted, the blue light emitted at various angles from the blue LED chip 103 are relatively uniformly absorbed or transmitted through the phosphor films 205 and 207, thereby producing more uniform white light overall. That is, color uniformity is additionally enhanced.

Also, as shown in FIG. 3, the phosphor films 205 and 207 separate from each other by the transparent resin encapsulant 230 may lower phosphor-induced optical loss. In a case where the phosphor powder mixture is dispersed in the resin encapsulant, secondary light (green light or red light) wavelength-converted by the phosphor is scattered by phosphor particles present on an optical path, thereby causing optical loss. However, in the embodiment of FIG. 3, the secondary light wavelength-converted by the thin green or red phosphor film 205 or 207 passes through the transparent resin encapsulant 230 or is emitted outside the light emitting device 200, thereby lowering optical loss resulting from the phosphor particles.

In the embodiment of FIG. 3, the blue LED chip has a dominant wavelength range, and the green and red phosphors have color coordinate space as described above, respectively. Accordingly, the white light source module 520 for the BLU of the LCD exhibits high color reproducibility across a very large space covering a substantially entire s-RGB space. This also reduces the number of the LED chips, and manufacturing costs for driving circuits and packages, thereby realizing lower unit costs. Of course, the blue, green and red light may have a FWAH ranging as described above.

Figure 4:
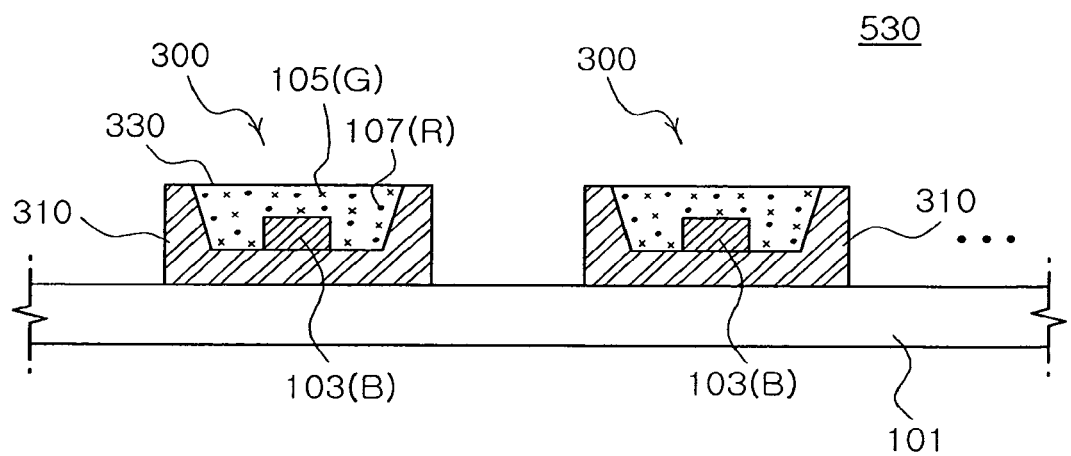
FIG. 4 is a cross-sectional view illustrating a white light emitting device and a white light source module according to an exemplary embodiment of the invention.
Figure 5:
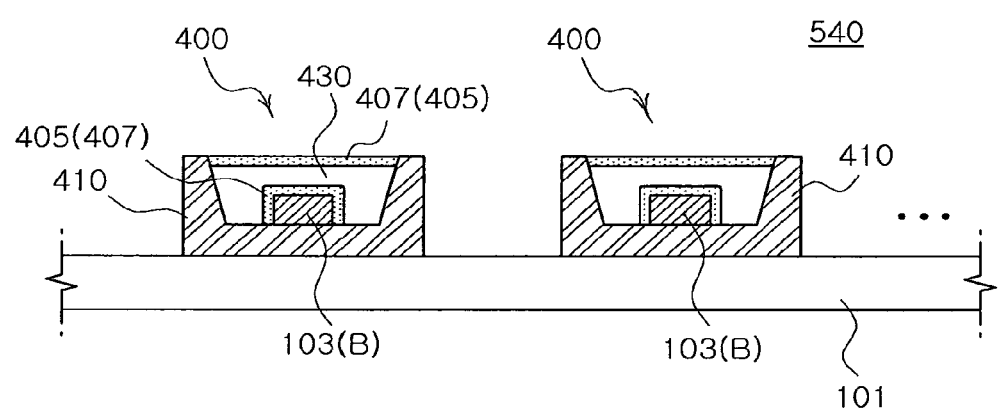
FIG. 5 is a cross-sectional view illustrating a white light emitting device and a white light source module according to an exemplary embodiment of the invention.

In the present embodiments described above, each of LED chips is directly mounted on the circuit board by a COB technique. However, the present invention is not limited thereto. For example, the LED chip may be mounted inside a package body mounted on the circuit board. FIGS. 4 and 5 illustrate additional package bodies employed according to an exemplary embodiment of the invention, respectively.

FIG. 4 is a cross-sectional view illustrating a white light emitting device 300 and a white light source module 530 using the same according to an exemplary embodiment of the invention. Referring to FIG. 4, a package body 310 defining a reflective cup is mounted on a circuit board 101. A blue B LED chip 103 is disposed on a bottom of the reflective cup defined by the package body 310 and a resin encapsulant 330 having a green R phosphor 105 and a red G phosphor 107 dispersed therein encapsulates the LED chip 103. To attain a surface or line light source with a desired area, a plurality of the white light emitting devices 300, i.e., a plurality of the LED packages may be arranged on the board 101.

Also in the embodiment of FIG. 4, the blue LED chip has a dominant wavelength range, and the red and green phosphors have color coordinate spaces as described above, respectively, thereby assuring high color reproducibility. Furthermore, the number of the LED chips, and manufacturing costs for driving circuits and packages are declined to realize lower unit costs.

FIG. 5 is a schematic cross-sectional view illustrating a white light emitting device and a white light source module 540 using the same according to an exemplary embodiment of the invention. Referring to FIG. 5, as in the embodiment of FIG. 4, the white light emitting device 400 includes a package body 410 defining a reflective cup and a blue LED chip 103 mounted on the reflective cup.

However, according to the present embodiment, the red and green phosphors are not dispersed and mixed in a resin encapsulant and provided as a phosphor film. That is, one of a green phosphor 405 and a red phosphor 407 is applied along a surface of the blue LED chip 103 and a transparent resin encapsulant 430 is formed thereon. Also, the other one of the green and red phosphors 405 and 407 is applied along a surface of the transparent resin encapsulant 430.

As in the embodiment of FIG. 3, in the embodiment of FIG. 5, the green phosphor film 405 and the red phosphor film 407 separated from each other by the resin encapsulant 430 are employed to ensure superior color uniformity. Also, in the same manner as the aforesaid embodiments, the blue LED chip has a dominant wavelength range and the red and green phosphors have color coordinate spaces as described above, thereby producing high color reproducibility across a very large space covering a substantially entire s-RGB space.

Figure 7:
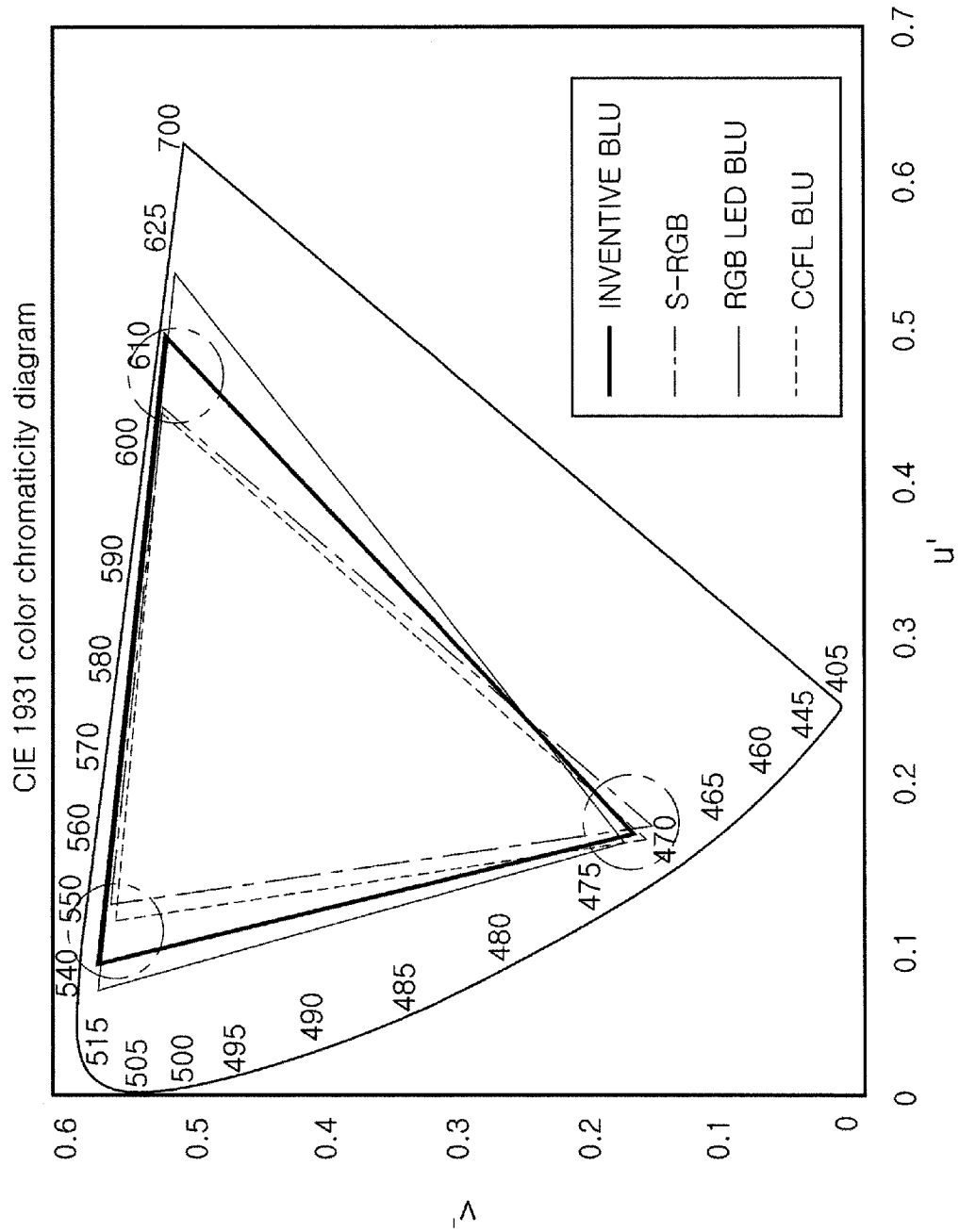
FIG. 7 illustrates a color coordinate range obtained in a case where white light source modules of Inventive Example and Comparative Example are employed in a backlight unit of a liquid crystal display (LCD).

FIG. 7 illustrates the CIE 1976 chromatic diagram indicating color coordinate ranges obtained in a case where white light source modules of Inventive Example and Comparative Example are employed in BLUs of LCDs, respectively.

Referring to FIG. 7, the white light source module of Inventive Example emits white light by a combination of a blue LED chip, a red phosphor and a green phosphor (see FIG. 4). In the white light source of Inventive Example, the blue LED chip has a dominant wavelength of 443 to 455 nm, particularly 451 nm. Also, the red phosphor emits red light having a color coordinate falling within a quadrilateral space defined by four coordinate points (0.5448, 0.4544), (0.7079, 0.2920), (0.6427, 0.2905) and (0.4794, 0.4633) based on the CIE 1931 color chromaticity diagram. The green phosphor emits green light having a color coordinate falling within a quadrilateral space defined by (0.1270, 0.8037), (0.4117, 0.5861), (0.4197, 0.5316) and (0.2555, 0.5030) based on the CIE 1931 color chromaticity diagram.

Meanwhile, the white light source module of Comparative Example 1 emits white light by a combination of red, green and blue LED chips. Also, a white light source module of Comparative Example 2 emits white light using a conventional cold cathode fluorescent lamp.

The chromaticity diagram of FIG. 7 indicates a color coordinate space of the LCD employing the light source module of Inventive Example as the BLU, and a color coordinate space of the LCDs employing the light sources of Comparative Example 1 and Comparative Example 2 as the BLUs, respectively. As shown in FIG. 7, the LCD adopting the BLU according to Inventive Example exhibits a very broad color coordinate space covering a substantially entire s-RGB space. This high color reproducibility is not attainable by a conventional combination of a blue LED chip, red and green phosphors.

The LCD utilizing the BLU (RGB LED BLUE) according to Comparative Example 1 employs only the LED chips as red, green and blue light sources, thus demonstrating a broad color coordinate space. However, as shown in FIG. 7, the LCD adopting the RGB LED BLU according to Comparative Example 1 disadvantageously does not exhibit a blue color in the s-RGB space. Also, only three-color LED chips employed without phosphors degrade color uniformity, while increasing the number of the LED chips required and manufacturing costs. Notably, this entails complicated configuration of an additional circuit for contrast increase or local dimming, and drastic increase in costs for the circuit configuration.

As shown in FIG. 7, the LCD employing the BLU (CCFL BLU) of Comparative Example 2 exhibits a relatively narrow color coordinate space, thus lowered in color reproducibility over the BLUs of Inventive Example and Comparative Example 1, respectively. Moreover, the CCFL BLU is not environment-friendly and can be hardly configured in a circuit for improving its performance such as local dimming and contrast adjustment.

As set forth above, according to exemplary embodiments of the invention, a blue LED chip having a dominant wavelength of a specific range, and red and green phosphors having a color coordinate of a specific space, respectively, are employed. This assures high color reproducibility which is hardly realized by a conventional combination of a blue LED chip, red and green phosphors. This also results in superior color uniformity and reduces the number of the LEDs necessary for a light source module for a BLU, and costs for packages and circuit configuration. In consequence, this easily produces a higher-quality and lower-cost white light source module and a backlight unit using the same.

While the present invention has been shown and described in connection with the exemplary embodiments, it will be apparent to those skilled in the art that modifications and variations can be made without departing from the spirit and scope of the invention as defined by the appended claims.

What is claimed:

1. A method for manufacturing a white light source module, the method comprising:
    disposing a blue LED chip on a substrate, the blue LED chip having a full width at half-maximum (FWHM) of 10 to 30 nm;
    selecting a red phosphor having a FWHM of 50 to 200 nm and such that red light emitted from the white light source module has a color coordinate falling within a space defined by four coordinate points (0.5448, 0.4544), (0.7079, 0.2920), (0.6427, 0.2905), and (0.4794, 0.4633) based on CIE 1931 color chromaticity diagram,
    wherein the red phosphor is at least one selected from the group consisting of: $CaAlSiN_3$:Eu and $Ca_2Si_5N_8$:Eu;
    selecting a green phosphor having a FWHM of 30 to 100 nm and such that green light emitted from the white light source module has a color coordinate falling within a space defined by four coordinate points (0.1270, 0.8037), (0.4117, 0.5861), (0.4197, 0.5316), and (0.2555, 0.5030) based on the CIE 1931 color chromaticity diagram; and
    disposing a mixture of the red phosphor and the green phosphor around the blue LED chip, wherein the red phosphor and the green phosphor are excited by light emitted from the blue LED chip and emit red light and green light, respectively, and the blue LED chip in combination with the red phosphor and the green phosphor emit white light.

2. The method for manufacturing a white light source module according to claim 1, wherein the mixture is a uniform mixture of the red phosphor and the green phosphor.

3. The method for manufacturing a white light source module according to claim 1, wherein the green phosphor is at least one selected from the group consisting of: $SrGa_2S_4$:Eu, β-SiAlON, and $A_2SiO_4$:Eu, wherein A comprises at least one of Ba, Sr, and Ca.

4. The method for manufacturing a white light source module according to claim 1, wherein the blue light emitting diode chip has a dominant wavelength of 443 to 455 nm.

5. A method for manufacturing a white light source module, the method comprising:
    disposing a blue LED chip on a substrate, the blue LED chip having a FWHM of 10 to 30 nm;
    selecting a red phosphor having a FWHM of 50 to 200 nm and such that red light emitted from the white light source module has a color coordinate falling within a space defined by four coordinate points (0.5448, 0.4544), (0.7079, 0.2920), (0.6427, 0.2905), and (0.4794, 0.4633) based on CIE 1931 color chromaticity diagram;
    selecting a green phosphor having a FWHM of 30 to 100 nm and such that green light emitted from the white light source module has a color coordinate falling within a space defined by four coordinate points (0.1270, 0.8037), (0.4117, 0.5861), (0.4197, 0.5316), and (0.2555, 0.5030) based on the CIE 1931 color chromaticity diagram,
    wherein the green phosphor is at least one selected from the group consisting of: β-SiAlON, and $A_2SiO_4$:Eu, wherein A comprises at least one of Ba, Sr, and Ca; and
    disposing a mixture of the red phosphor and the green phosphor around the blue LED chip, wherein the red phosphor and the green phosphor are excited by light emitted from the blue LED chip and emit red light and green light, respectively, and the blue LED chip in combination with the red phosphor and the green phosphor emit white light.

6. The method for manufacturing a white light source module according to claim 5, wherein the mixture is a uniform mixture of the red phosphor and the green phosphor.

7. The method for manufacturing a white light source module according to claim 5, wherein the red phosphor is at least one selected from the group consisting of: $CaAlSiN_3$:Eu, $Ca_2Si_5N_8$:Eu, and (Ca, Sr)S:Eu.

8. The method for manufacturing a white light source module according to claim 5, wherein the blue light emitting diode chip has a dominant wavelength of 443 to 455 nm.

9. A method for manufacturing a white light source module, the method comprising:
    disposing a blue LED chip on a substrate, the blue LED chip having a FWHM of 10 to 30 nm;
    selecting a red phosphor having a FWHM of 50 to 200 nm, wherein the red phosphor is at least one selected from the group consisting of: $CaAlSiN_3$:Eu and $Ca_2Si_5N_8$:Eu;
    selecting a green phosphor having a FWHM of 30 to 100 nm, wherein the green phosphor is at least one selected from the group consisting of: β-SiAlON, and $A_2SiO_4$:Eu, wherein A comprises at least one of Ba, Sr, and Ca; and
    disposing a mixture of the red phosphor and the green phosphor around the blue LED chip, wherein the red phosphor and the green phosphor are excited by light emitted from the blue LED chip and emit red light and green light, respectively, and the blue LED chip in combination with the red phosphor and the green phosphor emit white light.

10. The method for manufacturing a white light source module according to claim 9, red light emitted from the white light source module has a color coordinate falling within a space defined by four coordinate points (0.5448, 0.4544), (0.7079, 0.2920), (0.6427, 0.2905), and (0.4794, 0.4633) based on CIE 1931 color chromaticity diagram.

11. The method for manufacturing a white light source module according to claim 9, green light emitted from the white light source module has a color coordinate falling within a space defined by four coordinate points (0.1270, 0.8037), (0.4117, 0.5861), (0.4197, 0.5316), and (0.2555, 0.5030) based on the CIE 1931 color chromaticity diagram.

12. The method for manufacturing a white light source module according to claim 9, the disposing of the mixture of the red phosphor and the green phosphor includes forming a resin encapsulant encapsulating the blue light emitting diode chip, wherein the mixture of the green phosphor and the red phosphor are dispersed in the resin encapsulant.

13. The method for manufacturing a white light source module according to claim 9, wherein the blue light emitting diode chip has a dominant wavelength of 443 to 455 nm.

* * * * *